(12) United States Patent
Hu et al.

(10) Patent No.: US 9,691,940 B2
(45) Date of Patent: Jun. 27, 2017

(54) NITRIDE SEMICONDUCTOR STRUCTURE

(71) Applicant: Episil-Precision Inc., Hsinchu (TW)

(72) Inventors: Chih-Wei Hu, Hsinchu (TW); Jin-Ji Dai, Hsinchu (TW); Jung Hsuan, Hsinchu (TW)

(73) Assignee: Episil-Precision Inc., Hsinchu (TW)

( * ) Notice: Subject to any disclaimer, the term of this patent is extended or adjusted under 35 U.S.C. 154(b) by 0 days.

(21) Appl. No.: 15/147,916

(22) Filed: May 6, 2016

(65) Prior Publication Data

US 2016/0329462 A1 Nov. 10, 2016

(30) Foreign Application Priority Data

May 6, 2015 (TW) .............................. 104114432 A

(51) Int. Cl.
*H01L 33/12* (2010.01)
*H01L 33/32* (2010.01)
*H01L 21/02* (2006.01)

(52) U.S. Cl.
CPC .......... *H01L 33/12* (2013.01); *H01L 21/0243* (2013.01); *H01L 21/0254* (2013.01); *H01L 21/02381* (2013.01); *H01L 21/02447* (2013.01); *H01L 21/02458* (2013.01); *H01L 21/02507* (2013.01); *H01L 33/32* (2013.01)

(58) Field of Classification Search
CPC ...................................................... H01L 33/12
See application file for complete search history.

(56) References Cited

U.S. PATENT DOCUMENTS

| 5,192,987 | A | * | 3/1993 | Khan | ..................... | H01L 29/205 257/183.1 |
| 5,831,277 | A | * | 11/1998 | Razeghi | ................. | B82Y 20/00 257/103 |
| 6,104,039 | A | * | 8/2000 | Asatsuma | ............. | H01L 29/205 257/102 |

(Continued)

FOREIGN PATENT DOCUMENTS

| TW | 586136 | 5/2004 |
| TW | 201318202 | 5/2013 |

(Continued)

OTHER PUBLICATIONS

"Office Action of Taiwan Counterpart Application," issued on Jun. 2, 2016, p. 1-p. 5.

*Primary Examiner* — Eugene Lee
(74) *Attorney, Agent, or Firm* — Jianq Chyun IP Office

(57) ABSTRACT

A nitride semiconductor structure including a substrate, a cap layer, a nucleation layer, a transition layer and a composite buffer structure is provided. The cap layer is located on the substrate. The nucleation layer is located between the substrate and the cap layer. The transition layer is located between the nucleation layer and the cap layer, wherein the transition layer is an $Al_xGaN$ layer. The composite buffer structure is located between the transition layer and the cap layer. The composite buffer structure includes a first composite buffer layer, wherein the first composite buffer layer includes a plurality of first $Al_yGaN$ layers and a plurality of first GaN layers alternately stacking with each other, and the x is equal to the y.

17 Claims, 3 Drawing Sheets

(56) References Cited

U.S. PATENT DOCUMENTS

| | | | |
|---|---|---|---|
| 6,649,287 B2 | 11/2003 | Weeks, Jr. et al. | |
| 6,979,844 B2 * | 12/2005 | Moku | H01L 33/007 257/13 |
| 7,112,830 B2 | 9/2006 | Munns | |
| 7,115,896 B2 | 10/2006 | Guo et al. | |
| 8,362,503 B2 | 1/2013 | Saxler et al. | |
| 8,957,454 B2 * | 2/2015 | Briere | H01L 21/0237 257/194 |
| 9,070,619 B2 * | 6/2015 | Tsuchiya | H01L 21/02458 |
| 2005/0051804 A1 | 3/2005 | Yoshida | |
| 2005/0226295 A1 * | 10/2005 | Taneya | H01S 5/20 372/45.01 |
| 2009/0127583 A1 * | 5/2009 | Ohachi | B82Y 20/00 257/190 |
| 2011/0001127 A1 | 1/2011 | Sakamoto et al. | |
| 2012/0175589 A1 * | 7/2012 | Ooshika | H01L 33/32 257/13 |
| 2012/0223328 A1 * | 9/2012 | Ikuta | H01L 21/02381 257/76 |
| 2012/0261716 A1 | 10/2012 | Yanagihara | |
| 2012/0326209 A1 * | 12/2012 | Ooshika | H01L 21/02389 257/183 |
| 2013/0044782 A1 * | 2/2013 | Raring | B82Y 20/00 372/45.012 |

FOREIGN PATENT DOCUMENTS

| | | |
|---|---|---|
| TW | 201336108 | 9/2013 |
| WO | 2013047361 | 4/2013 |

* cited by examiner

NITRIDE SEMICONDUCTOR STRUCTURE

CROSS REFERENCE TO RELATED APPLICATION

This application claims the priority benefit of Taiwan application serial no. 104114432, filed on May 6, 2015. The entirety of the above-mentioned patent application is hereby incorporated by reference herein and made a part of this specification.

BACKGROUND OF THE INVENTION

1. Field of the Invention

The present invention relates to a semiconductor structure, and more specifically to a nitride semiconductor structure.

2. Description of Related Art

Nitride light-emitting diode has been widely applied at a variety of fields recently. In the nitride semiconductor structure, since the silicon substrate possesses advantages such as high thermal conductivity and low cost, a large scale nitride semiconductor structure, which uses a silicon substrate as a base, has become an important component of the nitride light-emitting diode.

However, take gallium nitride (GaN) semiconductor layer for example, a difference of a lattice between the gallium nitride semiconductor layer and the silicon substrate is 17%, and a difference of a coefficient of thermal expansion between the both is 54%. The above differences not only cause thin film fracture due to excessive thermal stress during cooling period, but also produce internal stress during the epitaxy process of the gallium nitride semiconductor layer, thereby generate thin film cracks and defect formation. Therefore, an issue desired to be solved is that how to overcome the problem of which the lattice and the coefficient of thermal expansion do not match well between the gallium nitride semiconductor layer and the silicon substrate, so as to reduce epitaxial wafer fracture and avoid defect formation.

SUMMARY OF THE INVENTION

The present invention provides a nitride semiconductor structure, which mitigates the problem of which the lattice and the coefficient of thermal expansion do not match well between the gallium nitride semiconductor layer and the silicon, so as to reduce epitaxial wafer fracture and avoid defect formation.

The present invention provides a nitride semiconductor structure, which comprises a substrate, a cap layer, a nucleation layer, a transition layer, and a composite buffer structure. The cap layer is located on the substrate. The nucleation layer is located between the substrate and the cap layer. The transition layer is located between the nucleation layer and the cap layer, wherein the transition layer is an $Al_xGaN$ layer. The composite buffer structure is located between the transition layer and the cap layer. The composite buffer structure includes a first composite buffer layer, wherein the first composite buffer layer includes a plurality of first $Al_yGaN$ layers and a plurality of first GaN layers alternately stacking with each other, and the x is equal to the y.

In an embodiment of the present invention, a thickness of the nucleation layer is ranged from 50 nm to 3000 nm.

In an embodiment of the present invention, the nucleation layer includes an aluminium nitride layer.

In an embodiment of the present invention, the nucleation layer includes a silicon carbide layer.

In an embodiment of the present invention, thicknesses of the first $Al_yGaN$ layers are the same, thicknesses of the first GaN layers are the same, and a number of the first $Al_yGaN$ layers is equal to a number of the first GaN layers.

In an embodiment of the present invention, the composite buffer structure further includes a second composite buffer layer located between the first composite buffer layer and the transition layer. The second composite buffer layer includes a plurality of second $Al_yGaN$ layers and a plurality of second GaN layers alternately stacking with each other.

In an embodiment of the present invention, thicknesses of the second $Al_yGaN$ layers are the same, thicknesses of the second GaN layers are the same, and a number of the second $Al_yGaN$ layers is equal to a number of the second GaN layers.

In an embodiment of the present invention, a thickness of the first $Al_yGaN$ layer is a1, a thickness of the first GaN layer is b1, a thickness of the second $Al_yGaN$ layer is a2, and a thickness of the second GaN layer is b2, wherein a1, b1, a2, and b2 satisfy the following inequality:

$$a1/(a1+b1)<a2/(a2+b2).$$

In an embodiment of the present invention, $0<x<0.5$.

In an embodiment of the present invention, the nitride semiconductor structure further comprises a top GaN layer, located between the first composite buffer layer and the cap layer, and a thickness of the top GaN layer is greater than a thickness of each of the first GaN layers.

In an embodiment of the present invention, the thickness of the top GaN layer is ranged from 10 nm to 2500 nm.

In an embodiment of the present invention, the nitride semiconductor structure further comprises a barrier layer, located between the top GaN layer and the cap layer.

In an embodiment of the present invention, a thickness of the barrier layer is ranged from 5 nm to 40 nm.

In an embodiment of the present invention, a thickness of the cap layer is ranged from 1 nm to 5 nm.

In an embodiment of the present invention, a material of the substrate includes silicon, sapphire or glass.

In an embodiment of the present invention, the substrate is a patterned substrate.

In an embodiment of the present invention, a thickness of the transition layer is ranged from 50 nm to 2000 nm.

In view of the above, in the nitride semiconductor structure of the present invention, the nucleation layer, the transition layer, and the composite buffer structure are stacked on the substrate in sequential order, wherein the transition layer is an $Al_xGaN$ layer, the composite buffer layer of the composite buffer structure may include a plurality of $Al_yGaN$ layers and a plurality of GaN layers alternately stacking with each other, and the x is equal to the y. Therefore, the nitride semiconductor structure of the present invention may allow the transition layer which is relatively close to the nucleation layer to have a mean aluminium content greater than a mean aluminium content of the composite buffer layer which is relatively remote from the nucleation layer by a difference between the thickness of the $Al_xGaN$ layer and the thickness of the $Al_yGaN$ layer, thereby effectively mitigates the strain produced by the mismatches of the lattice and the coefficient of thermal expansion between the top GaN layer (that is, the nitride semiconductor layer) and the substrate, thereby overcomes the drawback of which the excessive defects between the both.

In order to make the aforementioned and other objects, features and advantages of this invention comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
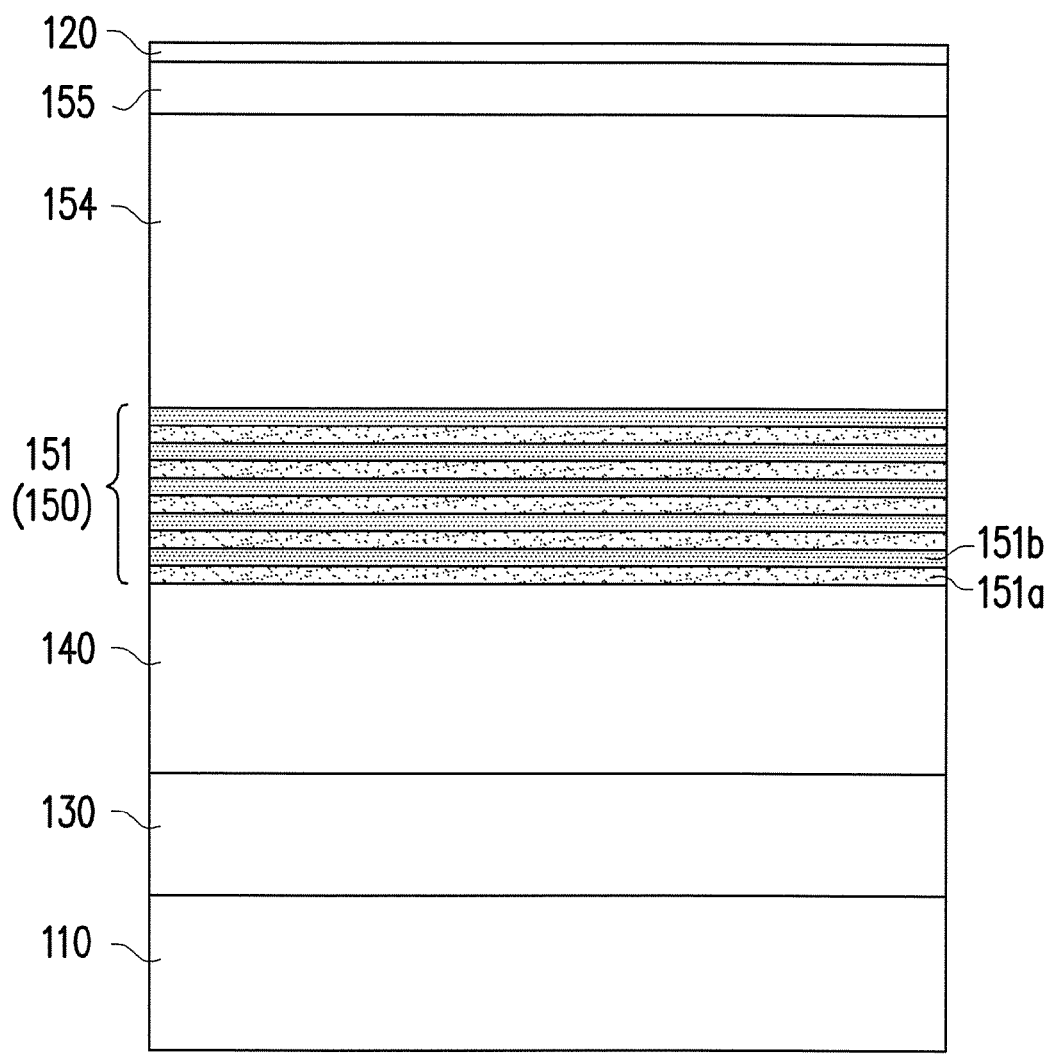
FIG. 1 is a schematic cross-sectional view illustrating a nitride semiconductor structure according to an embodiment of the present invention.

FIG. 1 is a schematic cross-sectional view illustrating a nitride semiconductor structure according to an embodiment of the present invention, wherein the first composite buffer layer is illustrated to indicate the alternately stacking of a plurality of first $Al_yGaN$ layers and a plurality of first GaN layers with each other, rather than representing the actual number of the layers. Referring to FIG. 1, in the present embodiment, the nitride semiconductor structure 100 includes a substrate 110, a cap layer 120, a nucleation layer 130, a transition layer 140, and a composite buffer structure 150, wherein a material of the substrate 110 may include silicon, sapphire, or glass. Take silicon substrate for example, substrate 110 may be a patterned silicon substrate, in which a pattern may be a regular or irregular micrometer pattern or nanometer pattern. For example, the substrate 110, after being patterned, may form a plurality of cavities (not shown), which allows the lateral growth of the epitaxial layer (that is, the nucleation layer 130), thereby reduces the occurrence of the dislocation.

The cap layer 120 is located on the substrate 110, and the nucleation layer 130 is located between the substrate 110 and the layer 120. The nucleation layer 130 may be an aluminium nitride (AlN) layer which is formed on the substrate 110 via methods such as metal-organic chemical vapor deposition (MOCVD) or physical vapor deposition (PVD). In other embodiments, the nucleation layer 130 may also be a silicon carbide (SiC) layer which is formed on the substrate 110 via chemical vapor deposition (CVD). In other words, the nucleation layer 130 of the present invention may be an aluminium nitride layer or a silicon carbide layer, wherein the aluminium nitride layer and the silicon carbide layer may respectively be formed by the method mentioned above, so as to grow on top of a planar silicon substrate or a patterned silicon substrate. Here, a thickness of the nucleation layer 130, for example, is ranged from 50 nm to 3000 nm.

The transition layer 140 is located between the nucleation layer 130 and the cap layer 120, wherein the transition layer 140, for example, may be an $Al_xGaN$ layer formed on top of the nucleation layer 130 via metal-organic chemical vapor deposition, and $0<x<0.5$. Here, a thickness of the transition layer 140, for example, is ranged from 50 nm to 2000 nm.

By utilizing the parameter design of the transition layer 140 mentioned above, the nitride semiconductor structure 100 of the present embodiment may effectively mitigate the strain produced by the mismatches of the lattice and the coefficient of thermal expansion between the cap layer 120 and the substrate 110. On the other hand, the composite buffer structure 150, which may include a first composite buffer layer 151, is located between the transition layer 140 and the cap layer 120. Here, the first composite buffer layer 151 may include a plurality of first $Al_yGaN$ layers 151a and a plurality of first GaN layers 151b alternately stacking with each other, wherein $0<y<0.5$, and the x is equal to the y.

In the present embodiment, the first composite buffer layer 151 may be formed by repeating the steps of first forming a first $Al_yGaN$ layer 151a on the transition layer 140 via metal-organic chemical vapor deposition, and then forming a first GaN layer 151b on the first $Al_yGaN$ layer 151a via metal-organic chemical vapor deposition, thereby forming a plurality of first $Al_yGaN$ layers 151a and a plurality of first GaN layers 151b alternately stacking with each other. In other embodiments, the first composite buffer layer 151 may also be formed by repeating the steps of first forming a first GaN layer 151b on the transition layer 140 via metal-organic chemical vapor deposition, and then forming a first $Al_yGaN$ layer 151a on the first GaN layer 151b via metal-organic chemical vapor deposition, thereby forming a plurality of first $Al_yGaN$ layers 151a and a plurality of first GaN layers 151b alternately stacking with each other. In other words, the present invention does not restrict the stacking sequence of the first $Al_yGaN$ layer 151a and the first GaN layer 151b. Here, thicknesses of the first $Al_yGaN$ layers 151a are the same, thicknesses of the first GaN layers 151b are the same, and a number of the first $Al_yGaN$ layers 151a is equal to a number of the first GaN layers 151b, wherein a thickness of the first $Al_yGaN$ layers 151a, for example, is ranged from 1 nm to 30 nm, and a thickness of the first GaN layers 151b, for example, is ranged from 1 nm to 30 nm. In addition, in the present embodiment, thicknesses of the first $Al_yGaN$ layers 151a are the same as thicknesses of the first GaN layers 151b, but the present invention is not limited to it.

Besides, the nitride semiconductor structure 100 further includes a top GaN layer 154, which, for example, is formed on the first composite buffer layer 151 via metal-organic chemical vapor deposition, with a thickness ranged from 10 nm to 2500 nm. The nitride semiconductor structure 100 further includes a barrier layer 155, which, for example, is an AlGaN layer formed on the top GaN layer 154 via metal-organic chemical vapor deposition, with a thickness ranged from 5 nm to 40 nm. In other words, in the present embodiment, before forming the cap layer 120 on the composite buffer structure 150, the top GaN layer 154 is first formed on the composite buffer structure 150, then the barrier layer 155 is formed on the top GaN layer 154, and the cap layer 120 is formed on the barrier layer 155 lastly. Herein, the deposition of the top GaN layer 154 may help improving the quality of the epitaxy.

Since the first composite buffer layer 151 of the present embodiment is a super lattice structure alternately stacked by a plurality of first $Al_yGaN$ layers 151a and a plurality of first GaN layers 151b, wherein an aluminium content of the first $Al_yGaN$ layers 151a that is relatively close to the nucleation layer 130 is the same as an aluminium content of the first $Al_yGaN$ layers 151a that is relatively remote from the nucleation layer 130, and utilizes a first GaN layer to substitute a conventional aluminium nitride layer, it may avoid the problem of the reduced production capacity caused by the time-consuming epitaxy process of the aluminium nitride layer, and also mitigate the stress produced due to the lattice and the coefficient of thermal expansion do not match well between the top GaN layer 154 and the substrate 110. Besides, the nucleation layer 130 may also be utilized to mitigate the stress produced due to the lattice and the coefficient of thermal expansion do not match well between the top GaN layer 154 and the substrate 110.

Specifically, the cap layer 120 is located on the composite buffer structure 150 and connected to the barrier layer 155. In other words, the barrier layer 155, for example, is located between the cap layer 120 and the top GaN layer 154, wherein a material of the cap layer 120 may include gallium nitride (GaN), and a method of forming the cap layer 120 may include metal-organic chemical vapor deposition. Here, a thickness of the cap layer 120, for example, is ranged from 1 nm to 5 nm.

In the present embodiment, the transition layer 140, for example, is an $Al_{0.25}GaN$ layer, with a thickness, for example, of 800 nm. Also, each of the first $Al_yGaN$ layers 151a may, for example, be an $Al_{0.25}GaN$ layer, wherein thicknesses of the first $Al_yGaN$ layers 151a and thicknesses of the first GaN layers 151b may, for example, be 4 nm, and a number of the first $Al_yGaN$ layers 151a and a number of the first GaN layers 151b may, for example, be 90. That is to say, the total thickness of these first $Al_yGaN$ layers 151a is 360 nm, therefore the transition layer 140 which is relatively close to the nucleation layer 130 would have a mean aluminium content greater than a mean aluminium content of the first composite buffer layer 151 which is relatively remote from the nucleation layer 130, thereby mitigates the strain produced by the difference of the coefficient of thermal expansion between the top GaN layer 154 and the substrate 110.

Other embodiments are listed below for explanation. What should be noted here is that, the below embodiments adopt the component numbers and part of the content of the embodiment described above, wherein the same number indicates the same or similar component, and omits the description of the same technical content. The description of the omitted part of the content could be referred to the embodiment described above, and would not be repeatedly described in the embodiments listed below.

Figure 2:
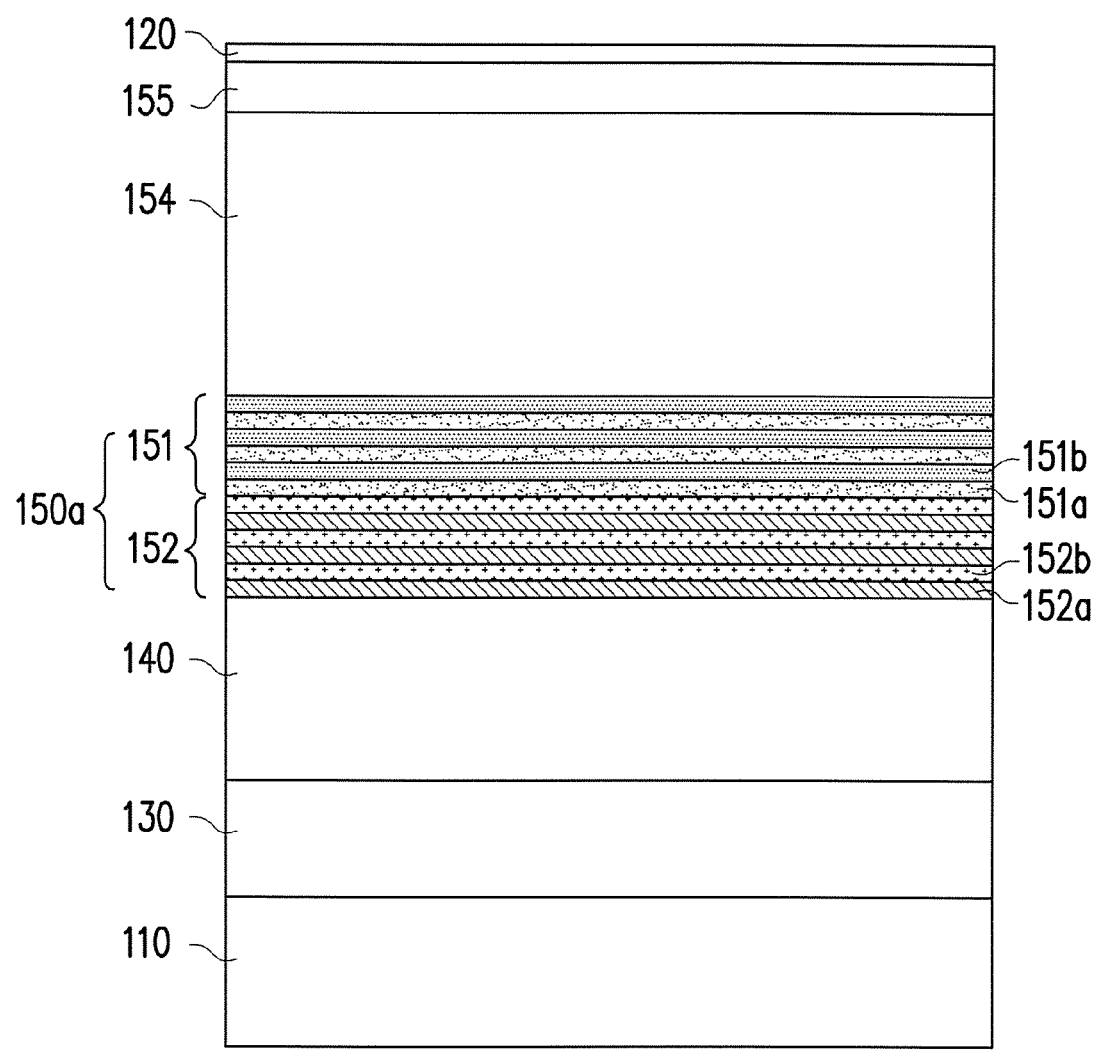
FIG. 2 is a schematic cross-sectional view illustrating a nitride semiconductor structure according to another embodiment of the present invention.

FIG. 2 is a schematic cross-sectional view illustrating a nitride semiconductor structure according to another embodiment of the present invention, wherein the first composite buffer layer is illustrated to indicate a plurality of first $Al_yGaN$ layers and a plurality of first GaN layers, and the second composite buffer layer is illustrated to indicate a plurality of second $Al_yGaN$ layers and a plurality of second GaN layers, rather than representing the actual number of the layers. It is noted that a main difference between the nitride semiconductor structure 100A of FIG. 2 and the nitride semiconductor structure 100 of FIG. 1 is that: the composition of the composite buffer structure is different. Please refer to FIG. 2, in the present embodiment, the composite buffer structure 150a further includes a second composite buffer layer 152 located between the first composite buffer layer 151 and the transition layer 140, wherein the second composite buffer layer 152 may include a plurality of second $Al_yGaN$ layers 152a and a plurality of second GaN layers 152b alternately stacking with each other, thicknesses of the second $Al_yGaN$ layers 152a are the same, and thicknesses of the second GaN layers 152b are the same. On the other hand, thicknesses of the second $Al_yGaN$ layers 152a are greater than thicknesses of the first $Al_yGaN$ layers 151a, and a sum of thickness of each of the second $Al_yGaN$ layers 152a and thickness of the corresponding second GaN layer 152b is equal to a sum of thickness of each of the first $Al_yGaN$ layers 151a and thickness of the corresponding first GaN layer 151b. That is, a total thickness of a first $Al_yGaN$ layer 151a and a first GaN layer 151b is equal to a total thickness of a second $Al_yGaN$ layer 152a and a second GaN layer 152b.

Here, a number of the first $Al_yGaN$ layers 151a, a number of the second $Al_yGaN$ layers 152a, a number of the first GaN layers 151b, and a number of the second GaN layers 152b are the same, therefore a thickness of the second composite buffer layer 152 would be equal to a thickness of the first composite buffer layer 151. The first $Al_yGaN$ layers 151a and the second $Al_yGaN$ layers 152a may, for example, be $Al_{0.25}GaN$ layers, wherein thicknesses of the second $Al_yGaN$ layers 152a may, for example, be 6 nm, thicknesses of the second GaN layers 152b may, for example, be 2 nm, and a number of the first $Al_yGaN$ layers 151a, a number of the second $Al_yGaN$ layers 152a, a number of the first GaN layers 151b, and a number of the second GaN layers 152b may, for example, be 60. That is to say, a sum of the total thickness of the first $Al_yGaN$ layers 151a and the total thickness of the second $Al_yGaN$ layers 152a is 600 nm. Since the transition layer 140 may, for example, be $Al_{0.25}GaN$ layer, and a thickness may, for example, be 800 nm, the transition layer 140 which is relatively close to the nucleation layer 130 would have a mean aluminium content greater than a mean aluminium content of the first composite buffer layer 151 and the second composite buffer layer 152 that are relatively remote from the nucleation layer 130, and the second composite buffer layer 152 which is relatively close to the nucleation layer 130 would have a mean aluminium content greater than a mean aluminium content of the first composite buffer layer 151 which is relatively remote from the nucleation layer 130, thereby mitigates the strain produced by the difference of the coefficient of thermal expansion between the top GaN layer 154 and the substrate 110.

From a different aspect, in the present embodiment, a thickness of the first $Al_yGaN$ layer 151a which is relatively remote from the nucleation layer 130 is a1, a thickness of the first GaN layer 151b which is relatively remote from the nucleation layer 130 is b1, a thickness of the second $Al_yGaN$ layer 152a which is relatively close to the nucleation layer 130 is a2, and a thickness of the second GaN layer 152b which is relatively close to the nucleation layer 130 is b2, while a1, b1, a2, and b2 mentioned above may satisfy the following inequality (1):

$$a1/(a1+b1) < a2/(a2+b2) \quad (1)$$

Figure 3:
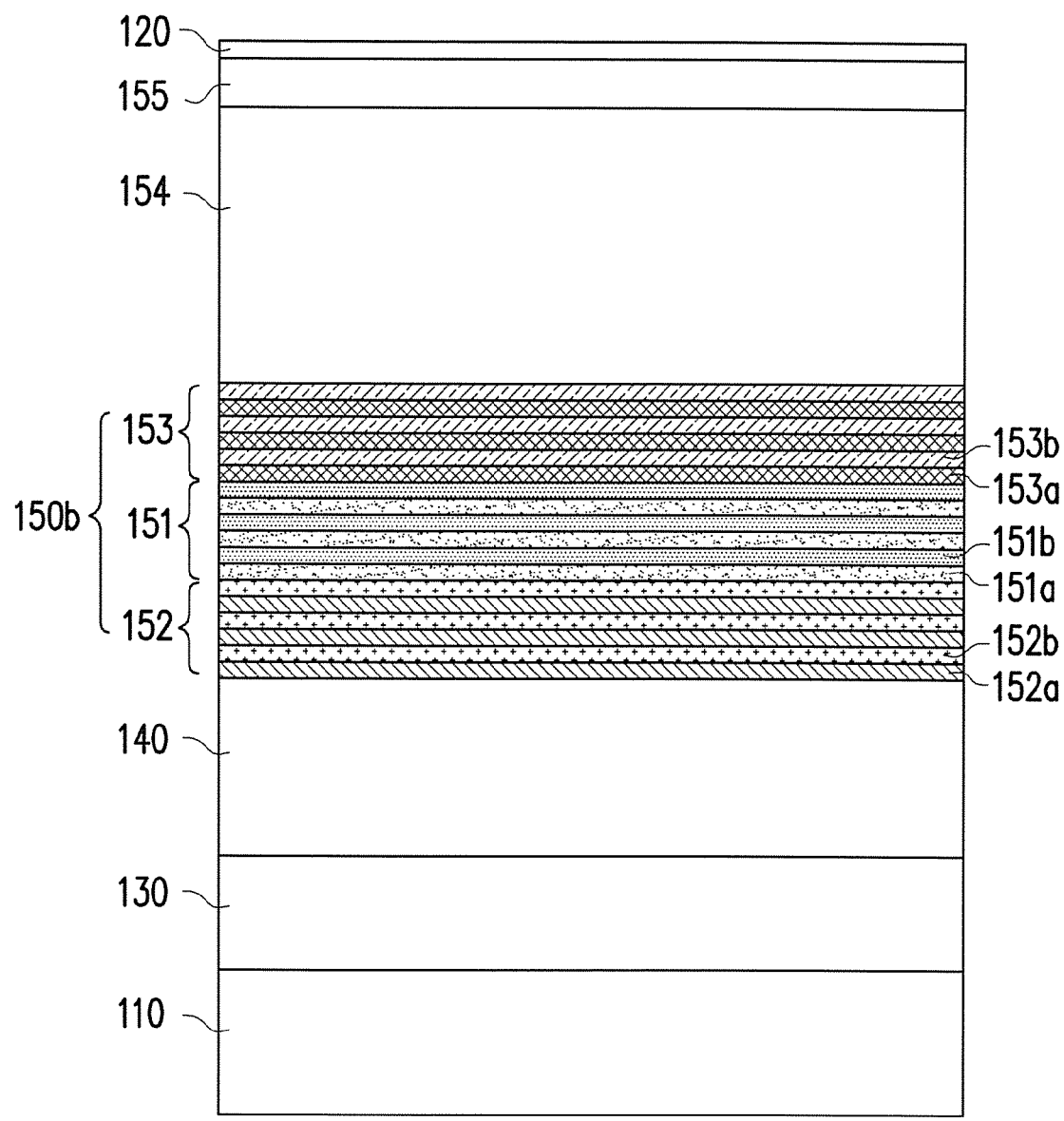
FIG. 3 is a schematic cross-sectional view illustrating a nitride semiconductor structure according to yet another embodiment of the present invention.

FIG. 3 is a schematic cross-sectional view illustrating a nitride semiconductor structure according to yet another embodiment of the present invention, wherein the first composite buffer layer is illustrated to indicate a plurality of first $Al_yGaN$ layers and a plurality of first GaN layers, the second composite buffer layer is illustrated to indicate a plurality of second $Al_yGaN$ layers and a plurality of second GaN layers, and a third composite buffer layer is illustrated to indicate a plurality of third $Al_yGaN$ layers and a plurality of third GaN layers, rather than representing the actual number of the layers. It is noted that a main difference between the nitride semiconductor structure 100B of FIG. 3 and the nitride semiconductor structure 100A of FIG. 2 is that: the composition of the composite buffer structure is different. Please refer to FIG. 3, in the present embodiment, the composite buffer structure 150b further includes a third composite buffer layer 153 located between the first composite buffer layer 151 and the top GaN layer 154, wherein the third composite buffer layer 153 may include a plurality of third $Al_yGaN$ layers 153a and a plurality of third GaN layers 153b alternately stacking with each other, thicknesses of the third $Al_yGaN$ layers 153a are smaller than thicknesses of the first $Al_yGaN$ layers 151a, and a sum of thickness of each of the third $Al_yGaN$ layers 153a and thickness of the corresponding third GaN layers 153b, a sum of thickness of each of the second $Al_yGaN$ layers 152a and thickness of the corresponding second GaN layer 152b, and a sum of thickness of each of the first $Al_yGaN$ layers 151a and thickness of the corresponding first GaN layer 151b are the same.

Here, a number of the first $Al_yGaN$ layers 151a, a number of the second $Al_yGaN$ layers 152a, a number of the third $Al_yGaN$ layers 153a, a number of the first GaN layers 151b, a number of the second GaN layers 152b, and a number of the third GaN layers 153b are the same as each other, therefore a thickness of the first composite buffer layer 151, a thickness of the second composite buffer layer 152, and a thickness of the third composite buffer layer 153 are the same as each other. The first $Al_yGaN$ layers 151a, the second $Al_yGaN$ layers 152a, and the third $Al_yGaN$ layers 153a may, for example, be $Al_{0.25}GaN$ layers, wherein thicknesses of the third $Al_yGaN$ layers 153a may, for example, be 2 nm, thicknesses of the third GaN layers 153b may, for example, be 6 nm, and a number of the first $Al_yGaN$ layers 151a, a number of the second $Al_yGaN$ layers 152a, a number of the third $Al_yGaN$ layers 153a, a number of the first GaN layers 151b, a number of the second GaN layers 152b, and a number of the third GaN layers 153b may, for example, be 60. That is to say, a sum of the total thickness of the first $Al_yGaN$ layers 151a, the total thickness of the second $Al_yGaN$ layers 152a, and the total thickness of the third $Al_yGaN$ layers 153a is 720 nm. Since the transition layer 140 may, for example, be $Al_{0.25}GaN$ layer, and a thickness may, for example, be 1000 nm, the transition layer 140 which is relatively close to the nucleation layer 130 would have a mean aluminium content greater than a mean aluminium content of the first composite buffer layer 151, the second composite buffer layer 152, and the third composite buffer layer 153 that are relatively remote from the nucleation layer 130, while the second composite buffer layer 152 which is relatively close to the nucleation layer 130 would have a mean aluminium content greater than a mean aluminium content of the first composite buffer layer 151 which is relatively remote from the nucleation layer 130, and the first composite buffer layer 151 which is relatively close to the nucleation layer 130 would have a mean aluminium content greater than a mean aluminium content of the third composite buffer layer 153 which is relatively remote from the nucleation layer 130, thereby mitigates the strain produced by the difference of the coefficient of thermal expansion between the top GaN layer 154 and the substrate 110.

From a different aspect, in the present embodiment, a thickness of the first $Al_yGaN$ layer 151a is a1, a thickness of the first GaN layer 151b is b1, a thickness of the second $Al_yGaN$ layer 152a which is relatively close to the nucleation layer 130 is a2, a thickness of the second GaN layer 152b which is relatively close to the nucleation layer 130 is b2, a thickness of the third $Al_yGaN$ layer 153a which is relatively remote from the nucleation layer 130 is a3, and a thickness of the third GaN layer 153b which is relatively remote from the nucleation layer 130 is b3, while a1, b1, a2, b2, a3, and b3 mentioned above may satisfy the following inequality (2):

$$a3/(a3+b3) < a1/(a1+b1) < a2/(a2+b2) \quad (2)$$

It should be noted that, while the present embodiment is described as a composite buffer structure having three layers of composite buffer layers, but the present invention is not restricted to it. Based on the design principle mentioned above, the closer the $Al_yGaN$ layer of each of the composite buffer layers is relative to the nucleation layer, the thicker the $Al_yGaN$ layer, and the composite buffer structure may also include 4, 5, or more layers of composite buffer layers.

Several experimental results are listed below as evidence of the effects of the embodiments mentioned above. Example 1 corresponds to the manufacture of the nitride semiconductor structure 100. That is, forming the nucleation layer 130 (AlN layer) with a thickness of 270 nm, the transition layer 140 ($Al_{0.25}GaN$ layer) with a thickness of 800 nm, the composite buffer structure 150, and the cap layer 120 with a thickness of 3 nm on the substrate 110 in sequential order, wherein the composite buffer structure 150 includes a first composite buffer layer 151 with a thickness of 720 nm, a top GaN layer 154 with a thickness of 2200 nm, and a barrier layer 155 with a thickness of 25 nm. Example 2 corresponds to the manufacture of the nitride semiconductor structure 100A. That is, forming the nucleation layer 130 (AlN layer) with a thickness of 270 nm, the transition layer 140 ($Al_{0.25}GaN$ layer) with a thickness of 800 nm, the composite buffer structure 150a, and the cap layer 120 with a thickness of 3 nm on the substrate 110 in sequential order, wherein the composite buffer structure 150a includes a first composite buffer layer 151 with a thickness of 960 nm, a second composite buffer layer 152, a top GaN layer 154 with a thickness of 1900 nm, and a barrier layer 155 with a thickness of 25 nm. Example 3 corresponds to the manufacture of the nitride semiconductor structure 100B. That is, forming the nucleation layer 130 (AlN layer) with a thickness of 270 nm, the transition layer 140 ($Al_{0.25}GaN$ layer) with a thickness of 1000 nm, the composite buffer structure 150b, and the cap layer 120 with a thickness of 3 nm on the substrate 110 in sequential order, wherein the composite buffer structure 150b includes a first composite buffer layer 151 with a thickness of 1440 nm, a second composite buffer layer 152, a third composite buffer layer 153, a top GaN layer 154 with a thickness of 1900 nm, and a barrier layer 155 with a thickness of 25 nm.

The main difference between Examples 1-3 is: the composition of the composite buffer structure, in which the composition of the first composite buffer layer 151, the second composite buffer layer 152, and the third composite buffer layer 153, the thickness of each of the layers, and the relationship of their relative disposition may be referred to the description of the embodiments mentioned above, and will not be repeated here again. The nitride semiconductor structure 100, 100A-100B of the Example 1-3 are tested as cooling down from 1050° C. to room temperature (about 25° C.), and the results are listed in the Table 1 below:

TABLE 1

| Example | Crack (mm) | Bow (mm) | Warp (mm) |
|---|---|---|---|
| 1 | 1.5 | 14.94 | 37.79 |
| 2 | 2 | 25.77 | 45.76 |
| 3 | 3 | 10.88 | 31.08 |

According to Table 1, after cooling down the nitride semiconductor structure 100, 100A-100B of the Example 1-3 from 1050° C. to room temperature (about 25° C.), the crack, the bow, and the warp of the structure which are caused by the differences of the coefficient of thermal expansion and the lattice between the top GaN layer 154 (that is, the nitride semiconductor layer) and the substrate 110 are being improved.

In view of above, in the nitride semiconductor structure of the present invention, the nucleation layer, the transition layer, and the composite buffer structure are stacked on the substrate in sequential order, wherein the transition layer is an $Al_xGaN$ layer, the composite buffer layer of the composite buffer structure may include a plurality of $Al_yGaN$ layers and a plurality of GaN layers alternately stacking with each other, and the x is equal to the y. Since the composite buffer layer is a super lattice structure alternately stacked by a plurality of $Al_yGaN$ layers and a plurality of GaN layers, and utilizes the GaN layer to substitute a conventional aluminium nitride layer, it may avoid the problem of the reduced production capacity caused by the time-consuming epitaxy process of the aluminium nitride layer, and also mitigate the stress produced due to the lattice and the coefficient of thermal expansion do not match well between the top GaN layer (that is, the nitride semiconductor layer) and the substrate, thereby overcomes the drawback of which the excessive defects between the both.

Although the present invention is disclosed as embodiments mentioned above, it is not mean to restrict the present invention. It will be apparent to those skilled in the art that various modifications and variations can be made to the structure of the present invention without departing from the scope or spirit of the invention. Therefore, the scope of the present invention should be defined by the following claims.

What is claimed is:

1. A nitride semiconductor structure, comprising:
   a substrate;
   a cap layer, located on the substrate;
   a nucleation layer, located between the substrate and the cap layer;
   a transition layer, located between the nucleation layer and the cap layer, wherein the transition layer is an $Al_xGaN$ layer; and
   a composite buffer structure, located between the transition layer and the cap layer, the composite buffer structure includes a first composite buffer layer, wherein the first composite buffer layer includes a plurality of first $Al_yGaN$ layers and a plurality of first GaN layers alternately stacking with each other, and the x is equal to the y,
   wherein a mean aluminium content of the transition layer is greater than a mean aluminium content of the composite buffer structure.

2. The nitride semiconductor structure of claim 1, wherein a thickness of the nucleation layer is ranged from 50 nm to 3000 nm.

3. The nitride semiconductor structure of claim 1, wherein the nucleation layer includes an aluminium nitride layer.

4. The nitride semiconductor structure of claim 1, wherein the nucleation layer includes a silicon carbide layer.

5. The nitride semiconductor structure of claim 1, wherein thicknesses of the first $Al_yGaN$ layers are the same, thicknesses of the first GaN layers are the same, and a number of the first $Al_yGaN$ layers is equal to a number of the first GaN layers.

6. The nitride semiconductor structure of claim 1, wherein the composite buffer structure further includes a second composite buffer layer located between the first composite buffer layer and the transition layer, the second composite buffer layer includes a plurality of second $Al_yGaN$ layers and a plurality of second GaN layers alternately stacking with each other.

7. The nitride semiconductor structure of claim 6, wherein thicknesses of the second $Al_yGaN$ layers are the same, thicknesses of the second GaN layers are the same, and a number of the second $Al_yGaN$ layers is equal to a number of the second GaN layers.

8. The nitride semiconductor structure of claim 6, wherein a thickness of the first $Al_yGaN$ layer is a1, a thickness of the first GaN layer is b1, a thickness of the second $Al_yGaN$ layer is a2, and a thickness of the second GaN layer is b2, wherein a1, b1, a2, and b2 satisfy the following inequality:

$$a1/(a1+b1) < a2/(a2+b2).$$

9. The nitride semiconductor structure of claim 1, wherein $0 < x < 0.5$.

10. The nitride semiconductor structure of claim 1, further comprises:
    a top GaN layer, located between the first composite buffer layer and the cap layer, and a thickness of the top GaN layer is greater than a thickness of each of the first GaN layers.

11. The nitride semiconductor structure of claim 10, wherein the thickness of the top GaN layer is ranged from 10 nm to 2500 nm.

12. The nitride semiconductor structure of claim 10, further comprises:
    a barrier layer, located between the top GaN layer and the cap layer.

13. The nitride semiconductor structure of claim 12, wherein a thickness of the barrier layer is ranged from 5 nm to 40 nm.

14. The nitride semiconductor structure of claim 1, wherein a thickness of the cap layer is ranged from 1 nm to 5 nm.

15. The nitride semiconductor structure of claim 1, wherein a material of the substrate includes silicon, sapphire or glass.

16. The nitride semiconductor structure of claim 1, wherein the substrate is a patterned substrate.

17. The nitride semiconductor structure of claim 1, wherein a thickness of the transition layer is ranged from 50 nm to 2000 nm.

* * * * *